(12) United States Patent
Zhang et al.

(10) Patent No.: US 10,076,719 B2
(45) Date of Patent: Sep. 18, 2018

(54) FAN AIR FILTER WITH TOOL-LESS FILTER REPLACEMENT

(71) Applicant: DELL PRODUCTS, L.P., Round Rock, TX (US)

(72) Inventors: Joanne C. Zhang, San Jose, CA (US); Thuy Thanh Vu, San Jose, CA (US); Mike Morihata, Santa Clara, CA (US)

(73) Assignee: Dell Products, L.P., Round Rock, TX (US)

( * ) Notice: Subject to any disclaimer, the term of this patent is extended or adjusted under 35 U.S.C. 154(b) by 113 days.

(21) Appl. No.: 15/212,845

(22) Filed: Jul. 18, 2016

(65) Prior Publication Data

US 2018/0020575 A1    Jan. 18, 2018

(51) Int. Cl.
*H05K 7/20* (2006.01)
*B01D 46/42* (2006.01)
*B01D 46/00* (2006.01)

(52) U.S. Cl.
CPC ..... *B01D 46/4254* (2013.01); *H05K 7/20181* (2013.01); *H05K 7/20563* (2013.01); *B01D 46/008* (2013.01); *B01D 46/0086* (2013.01); *B01D 46/4227* (2013.01); *B01D 2279/45* (2013.01)

(58) Field of Classification Search
CPC .. H05K 7/20; H05K 7/20181; H05K 7/20736; G11B 33/02; G11B 333/124; F04D 25/12; G06F 1/20; B01D 50/00; B03C 3/011; B03C 3/00
USPC ... 55/385.1, 385.6, 423, 479, 482, 483, 493, 55/524, DIG. 34; 454/184, 185, 187, 454/192; 361/690–697, 687, 727, 801, 361/812, 816, 818, 831; 96/414–417; 312/223.2, 223.3; 210/488, 489, 498
See application file for complete search history.

(56) References Cited

U.S. PATENT DOCUMENTS

| 4,846,859 | A | 7/1989 | Nobiraki et al. |
| 6,319,116 | B1 * | 11/2001 | Behl ............... G11B 33/02 361/753 |
| 6,853,551 | B2 | 2/2005 | Baar et al. |

(Continued)

OTHER PUBLICATIONS

Universal Air Filter, "Rackmount Server Air Filters", https://www.uaf.com/industries-applications/military-air-filters/rackmount/server-air-filters/, downloaded from the internet May 28, 2016.

*Primary Examiner* — Duane Smith
*Assistant Examiner* — Minh-Chau Pham
(74) *Attorney, Agent, or Firm* — Isidore PLLC

(57) ABSTRACT

An information handling system (IHS) includes a node having a node enclosure provisioned with at least one heat-generating component. A device that provides infrastructure support to the node contains an air mover is attached to the node enclosure. The air mover creates cooling air flow through the node to absorb and transfer thermal energy from the at least one heat-generating component. An air filter enclosure is attachable over an air intake of the device. The air filter enclosure has a top slot sized to receive a manually inserted air filter into an air filter receiving frame. Replacement of the air filter can be achieved without tools. The air filter filters the air prior to the air entering the node enclosure to remove impurities and possible particulates that can damage the internal components of the device.

16 Claims, 8 Drawing Sheets

(56) References Cited

U.S. PATENT DOCUMENTS

| | | | | |
|---|---|---|---|---|
| 7,068,506 B2* | 6/2006 | Behl | .................. | G06F 1/20 |
| | | | | 174/16.3 |
| 7,178,583 B2 | 2/2007 | Huang | | |
| 7,499,275 B2* | 3/2009 | Lai | .................. | H05K 7/20181 |
| | | | | 361/690 |
| 7,804,690 B2* | 9/2010 | Huang | .............. | H05K 7/20736 |
| | | | | 312/223.2 |
| 8,089,763 B2* | 1/2012 | Lin | .................. | H05K 7/20736 |
| | | | | 361/690 |
| 2006/0070527 A1 | 4/2006 | Chapman et al. | | |
| 2008/0151492 A1 | 6/2008 | Maddox | | |
| 2008/0160898 A1* | 7/2008 | Pfannenberg | .......... | F04D 25/12 |
| | | | | 454/184 |
| 2009/0044703 A1* | 2/2009 | Bias | .................. | B03C 3/12 |
| | | | | 96/66 |
| 2011/0124278 A1* | 5/2011 | Lee | .................. | G11B 33/124 |
| | | | | 454/184 |

* cited by examiner

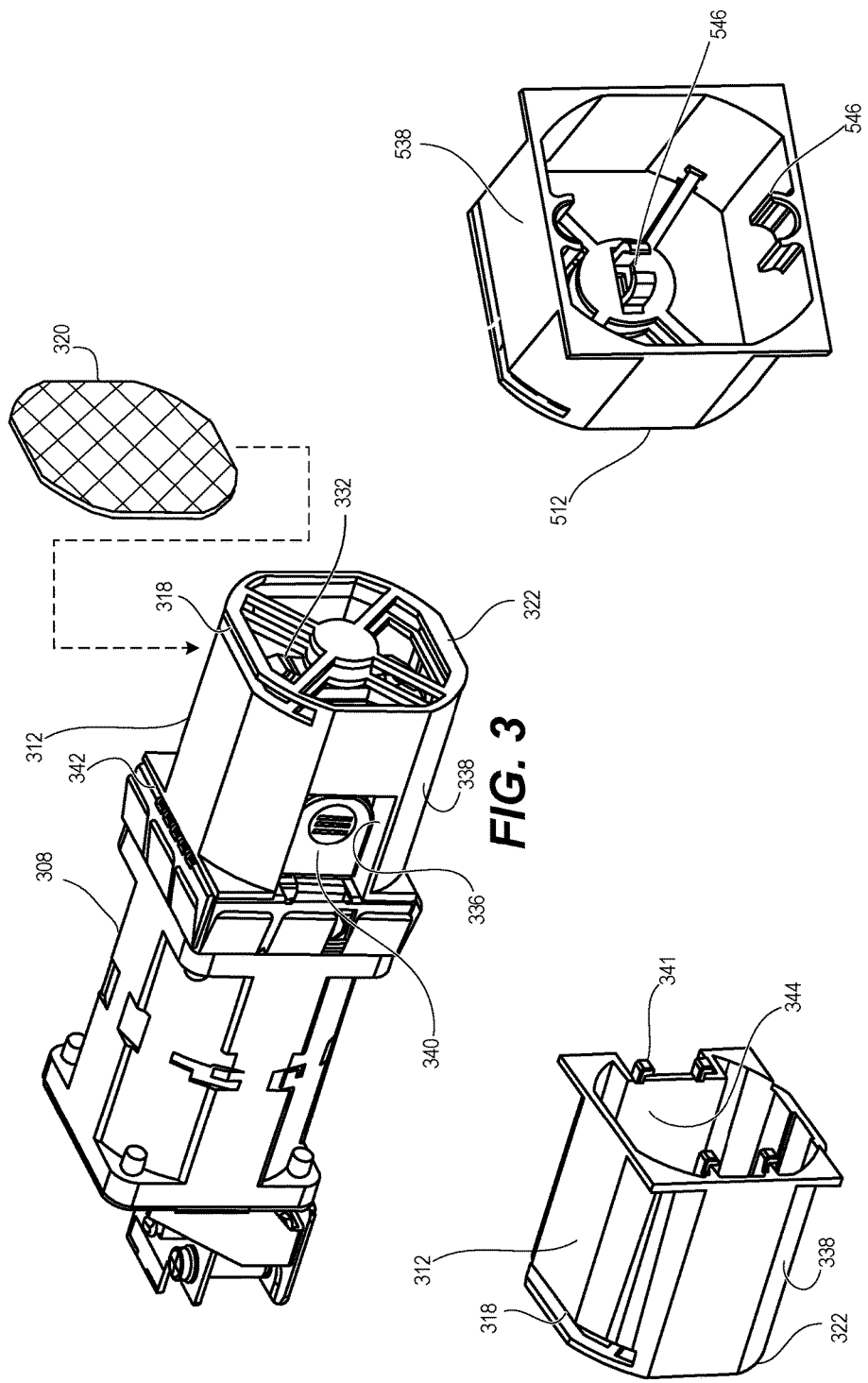

FAN AIR FILTER WITH TOOL-LESS FILTER REPLACEMENT

BACKGROUND

1. Technical Field

This disclosure generally relates to information handling systems (IHSs), and more particularly to an air filtration system for an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs are critical parts of certain telecommunication systems whose availability must be maintained. One risk to availability is device failures due to environmental contamination and particles in cooling air. Network Equipment Building System (NEBS) family of standards is designed to keep the network running. Most Telecommunication Carrier Group (TCG) members require NEBS Level 3 for equipment operation in the central office. Level 3 criteria provide the highest assurance of product operability. In particular, standards for air filters designs are dictated by NEBS Telcordia GR63-CORE, section 4.1.5.2. Typically, compliance requires a custom design for each node product because of differences in the placement of power supply units (PSUs) and fans in particular nodes of an IHS. Trays, connectors, and power cable exit points can differ widely. Generally known retrofits to add air filters to information technology (IT) equipment are product specific and entails custom made sheet metal structures that require substantially high tooling costs. The known approach includes fabricating and installing a fan filter assembly spanning the width of the IT equipment. Some PSUs and fan modules have a handle spanning the area of the fan intake vents that complicate adding air filters. To replace any single defective PSU or fan tray, the entire fan filter assembly has to be unfastened and removed. Additionally, status indicator lights provided by original equipment manufacturers (OEMs) on the PSUs and fan modules are generally obscured by the retrofitted fan filter assembly.

BRIEF SUMMARY

The illustrative embodiments of the present disclosure provide an information handling system (IHS) that uses an air filter that can be efficiently inserted and removed/replaced to protect air cooled nodes. A node of the IHS has a node enclosure provisioned with at least one heat-generating component. A device that provides infrastructure support to the node and that contains an air mover is attached to the node enclosure. The air mover creates cooling air flow through the node to absorb and transfer thermal energy from the at least one heat-generating component. An air filter enclosure is attachable over an air intake of the device. The air filter enclosure has a top slot sized to receive a manually inserted air filter into an air filter receiving frame. The air filter filters the air prior to the air entering the node enclosure to remove impurities and possible particulates that can damage the internal components of the device. Replacement of the air filter can be achieved without tools yet meet stringent industry standards.

According to at least one aspect of the present disclosure, an air filter enclosure is attachable over an air intake of a device that provides infrastructure support to a node. The air filter enclosure includes a replaceable air filter. The air filter enclosure has a top slot sized to receive the replaceable air filter into an air filter receiving frame. The device contains an air mover attached to a node enclosure of the node of the IHS. The air mover creates cooling air flow through the node to absorb and transfer thermal energy from at least one heat-generating component, and the air filter filters the air prior to the air entering the node enclosure to remove impurities and possible particulates that can damage the internal components of the device. The air filter enclosure provides for retention of the air filter that is simple, such as being on top or by forming an interference fit or latching surface.

According to at least one aspect of the present disclosure, a method is provided of installing an air filter enclosure and air filter in an IHS. In one or more embodiments, the method includes making an air filter enclosure to create an air filter receiving frame that is sized to cover an air intake of a device that provides infrastructure support. The method includes forming a top slot in the air filter enclosure to create an air filter receiving frame that is sized to receive a replaceable air filter. The method includes attaching the air filter enclosure to the device containing an air mover of a node of the IHS.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 3 illustrates an isometric view of a fan module and a third example air filter enclosure, according to one or more embodiments;

FIG. 4 illustrates an isometric view of the third example air filter enclosure of FIG. 3, according to one or more embodiments;

FIG. 5 illustrates an isometric view of a fourth example air filter enclosure, according to one or more embodiments;

DETAILED DESCRIPTION

Figure 1:
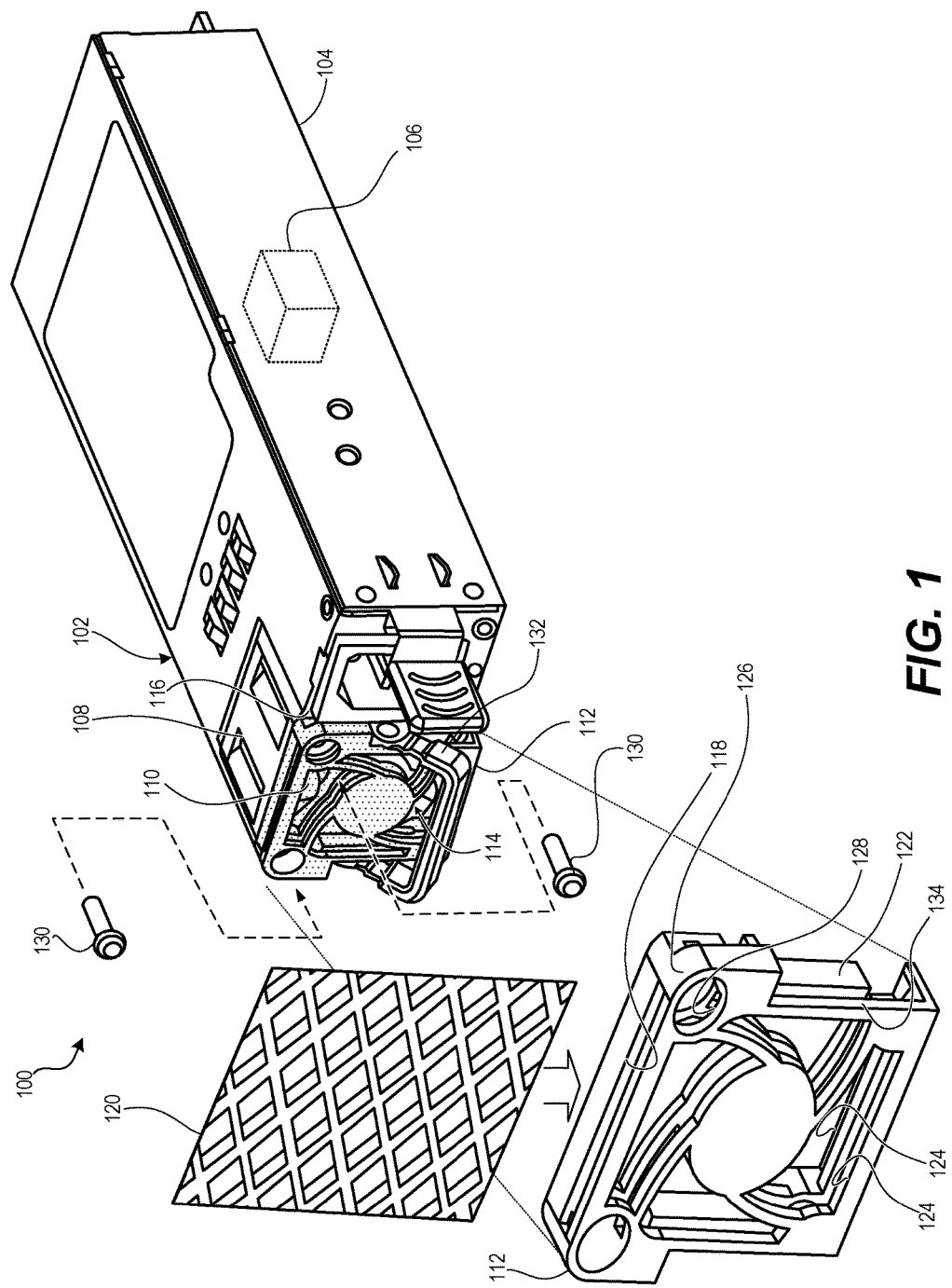
FIG. 1 illustrates an isometric view of a node of an Information Handling System (IHS) with a disassembled air filter and a first example air filter enclosure, according to one or more embodiments.

According to one or more embodiments, an information handling system (IHS) includes at least one node that has a node enclosure provisioned with at least one heat-generating component. A device containing an air mover is attached to the node enclosure. The device provides infrastructure support to the node, such as for electrical power conversion or air cooling. The air mover creates cooling air flow through the node to absorb and transfer thermal energy from the at least one heat-generating component. As one example, the device can be a fan module having air mover of one or more fan modules that cools information technology (IT) components of a node. As another example, the device can be a power supply unit (PSU) received in the node and having an air mover to cool its own electrical power conversion components. The device has an air intake and an opposing air exhaust, with the fan positioned between the air intake and the air exhaust. An air filter enclosure is attachable over the air intake of the device. The air filter enclosure provides an air filter receiving frame sized to receive a manually inserted air filter via a slot provided within one side (e.g., the top) of the enclosure. The slot provides for secure capture of replaceable air filters without requiring a tool to insert or remove the replaceable air filter. In one or more embodiments, the air filter enclosure is a molded component that can be economically retrofitted onto IHSs in order to comply with increased air filtration requirements. The air filter enclosure in its various configurations can accommodate different types of handles that may be present on the devices.

As utilized herein, an IHS can be "rack-configured", which generally refers to the configuration of a large scale server system within a physical rack having multiple chassis receiving rails for receiving specific sizes of information technology (IT) nodes, such as server modules, storage modules, and power modules. The term node generally refers to each separate unit inserted into a 1U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates an information handling system (IHS) 100 having one or more nodes 102. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Each node 102 of IHS 100 has a node enclosure 104 provisioned with at least one heat-generating component 106. A device, such as fan module 108, is attached to node 102. Fan module 108 contains an air mover 110 such as a fan, which is utilized to create cooling air flow through the node 102 to absorb and transfer thermal energy from the at least one heat-generating component 106. An air filter enclosure 112 is attachable over an air intake 114 at an exterior face 116 of the device (fan module 108). A top slot 118 formed in the air filter enclosure 112 is sized to accommodate manual insertion of replaceable air filter 120 without a tool. The air filter enclosure 112 has an air filter receiving frame 122 that constrains the replaceable air filter 120 received through the top slot 118. The air filter receiving frame 122 can be configured with an air permeable barrier at its front and back, such as by having aligned apertures 124 that define air passages through the air filter receiving frame 122.

In one or more embodiments, air filter enclosure 112 can be economically formed out of a molded material. In some instances, the fan module 108 has a visual indication of a node-level or device-level operating status that is externally presented proximate to the air intake. Air filter enclosure 112 can be formed from a transparent or translucent plastic or resin material that allows viewing of the visual indication. The air filter enclosure 112 can have a mounting surface 126 that is peripheral to the air filter receiving frame 122. The mounting surface 126 can have at least one enclosure fastener hole 128 that is aligned with a selected one of one or more device fastener holes (not shown) of the exterior face 116 of the fan module 108. In some instances, fasteners 130 used by original equipment manufacturer (OEM) of the fan module 108 have sufficient length to be used in fastening together both the air filter enclosure 112 and fan module 108. The fasteners 130 can also be longer, in order to have sufficient length to further attach air filter enclosure 112 and fan module 108 to the node enclosure 104.

For clarity, the air filter enclosure 112 has a top slot 118 that can retain air filters inside of the air filter enclosure 112. In one or more embodiments, a slot can be presented on other sides of the air filter enclosure with the air filter enclosure 112 including a retention feature. For example, a manually positioned latch or door can close the slot. An air filter can have a width or structure that engages within the slot. For another example, the air filter or the air filter enclosure can have a releasable adhesive surface that is sufficiently tacky to hold the light weight of the air filter.

Air filter enclosure 112 accommodates an extraction handle of the fan module 108, in this instance an edge mounted, bail handle 132. The air filter enclosure 112 has at least one edge relief area 134 enabling positioning of the air filter enclosure 112 over the air intake 114 while accommodating bail handle 132 of fan module 108.

Figure 2:
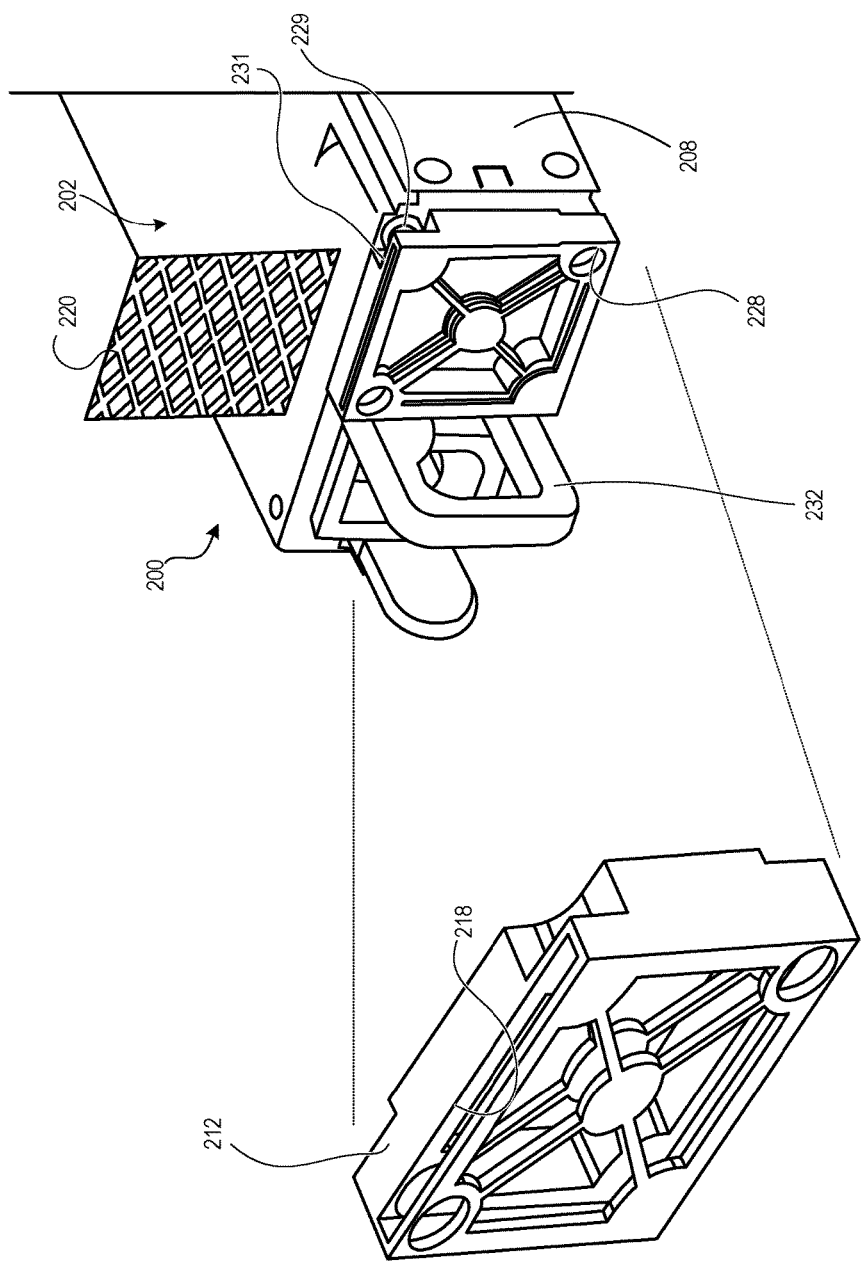
FIG. 2 illustrates an isometric detailed view of a node of an IRS with a disassembled air filter and second example air filter enclosure, according to one or more embodiments.

FIG. 2 illustrates node 202 of an IHS 200 with an air filter enclosure 212 that is attachable to a device such as a PSU 208 that has an air mover such as a single fan (not shown). An extraction handle 232 of the PSU 208 does not obstruct mounting of the air filter enclosure 212. Two opposite corner fastener holes 228 can be attached by fasteners (not shown). The other two opposite corners of the air filter enclosure 212 can have a back side depression 229 to allow two original fasteners 231 of the PSU 208 to remain undisturbed. The air filter enclosure 212 has a top slot 218 for receiving a replaceable air filter 220. It is appreciated that while the various embodiments illustrated by the figures and described herein present a top slot 218, the location of the slot for insertion of the air filter can be on one or both of the sides, in one embodiment, and on the bottom, in another embodiment. With the later embodiment, for example, the air filter can be manufactured to tightly fit inside the frame and not become easily dislodged from the enclosure 212.

FIGS. 3-4 both illustrate a third example of air filter enclosure 312 that accommodates extraction handle 332. In one embodiment, extraction handle 332 is rigidly attached. Air filter enclosure 312 has an indented side wall 336 of a shroud 338 that engages a side tab 340 of the device 308. FIG. 4 illustrates that mounting hooks 341 at a mating surface 342 (FIG. 3) of the shroud 338 are received by an exterior face of the device 308 (FIG. 3). The shroud 338 and air filter frame 322 define an internal cavity 344 encompassing the extraction handle 332 (FIG. 3). The air filter enclosure 312 has a top slot 318 for receiving a replaceable air filter 320.

Figure 6:
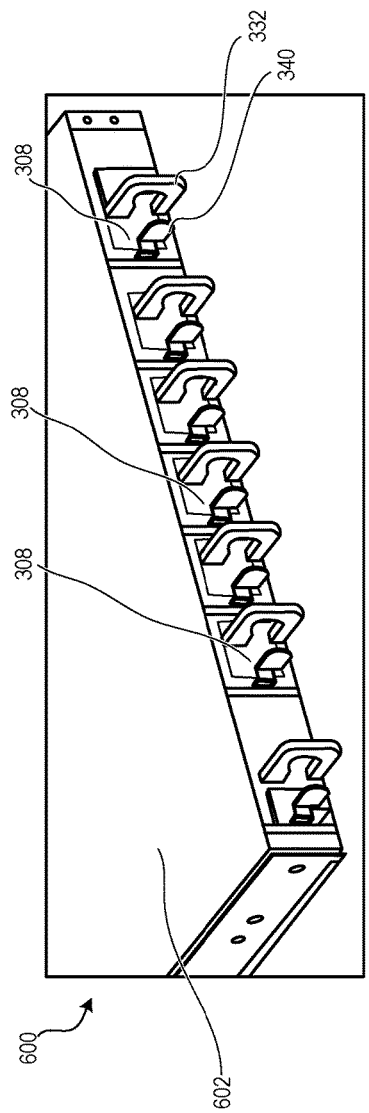
FIG. 6 illustrates an isometric view of a node having a row of devices with air movers and having a handle, according to one or more embodiments.
Figure 7:
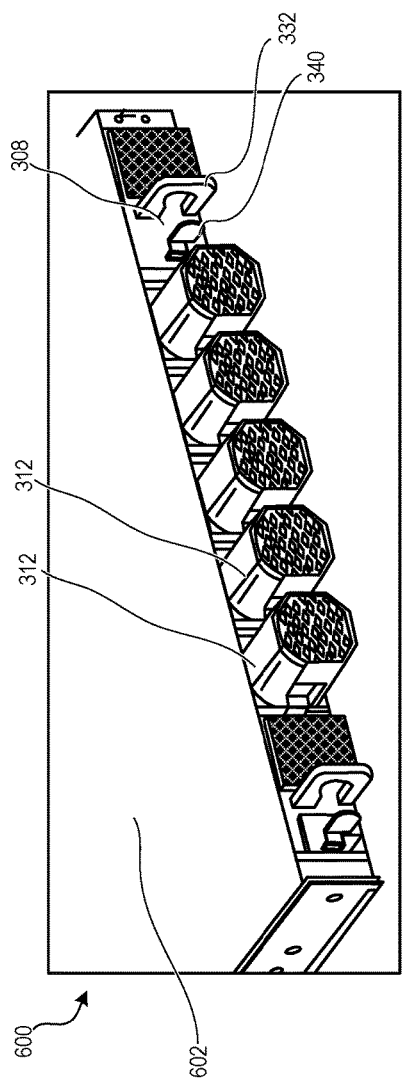
FIG. 7 illustrates an isometric view of the node of FIG. 6 with air filter enclosures of FIGS. 3-4 attached, according to one or more embodiments.

FIG. 5 illustrates an air filter enclosure 512 that has a shroud 538 having engagement clips 546 that are internally presented to engage an extraction handle (not shown). FIG. 6 illustrates a node 602 of an IHS 600 having a row of devices 308, each having a handle 332 and side tab 340. FIG. 7 illustrates the node 602 with air filter enclosures 312 attached to respective devices 308. The shroud 538 can provide complete air filtration for fan modules, PSUs, or other infrastructure devices that have air intakes that are not on one simple flat surface. For example, the air intakes can be on two orthogonal sides. For another example, the infrastructure devices can have other interfering structures close to the air intake. Providing a shroud 538 specific to an individual device rather than an entire node or rack-configured IHS can allow system interconnections or service access to other IT of infrastructure components without having to disrupt air filtration capabilities.

Figure 8:
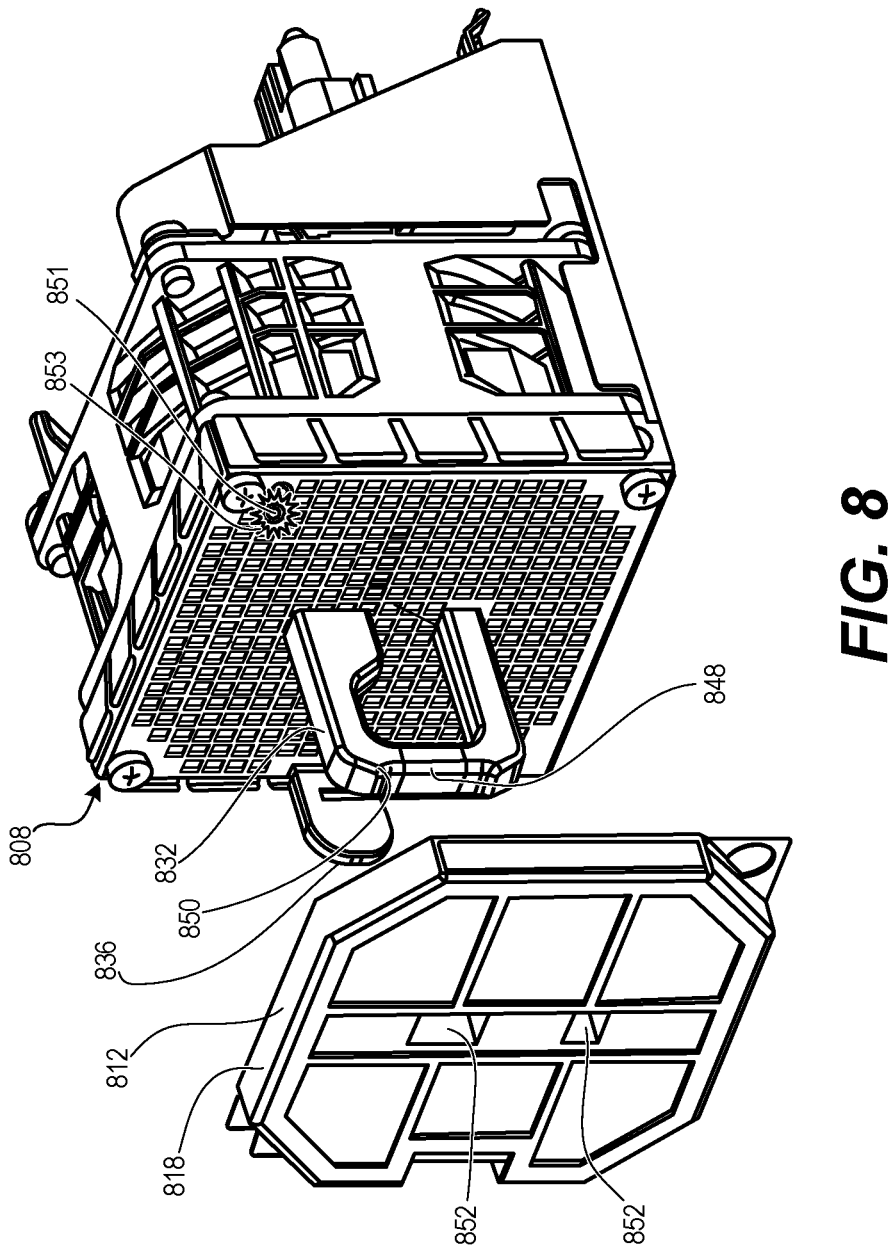
FIG. 8 illustrates an isometric view of a two rack unit (2RU) fan module with a fifth example air filter enclosure, according to one or more embodiments.
Figure 9:
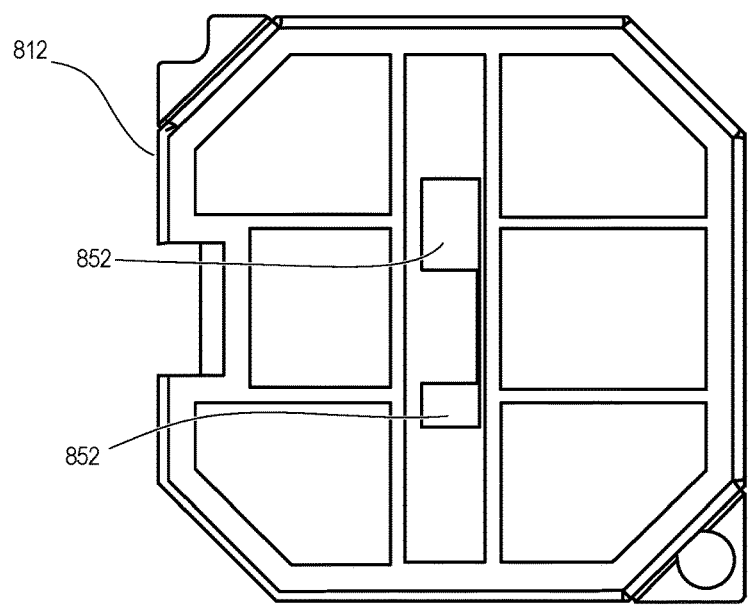
FIG. 9 illustrates a side frontal view of the fifth example air filter enclosure of FIG. 8, according to one or more embodiments.
Figure 10:
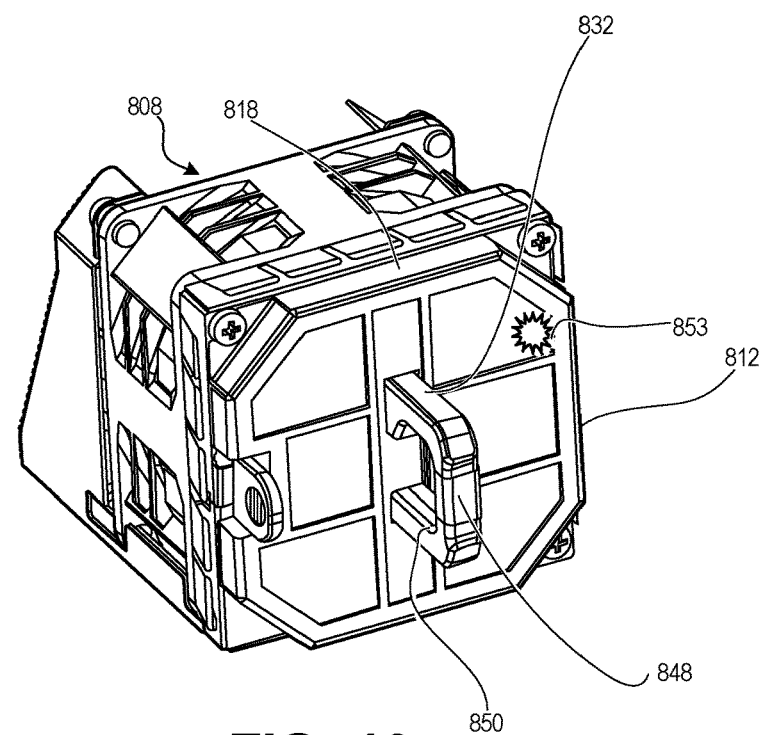
FIG. 10 illustrates an isometric view of the fifth example air filter enclosure attached to the 2RU fan module of FIG. 8, according to one or more embodiments.

FIG. 8 illustrates a two rack unit (2RU) fan module 808 with a fifth example of an air filter enclosure 812. Air filter enclosure 812 accommodates a handle 832 that has a disengageable portion 848 of a grip 850. A visual indicator such as light 851 can provide an illuminated operation status 853 of the IHS, node or device. FIG. 9 illustrates two openings 852 in the air filter enclosure 812 that the handle 832 can be extended through with the disengageable portion 848 removed. A top slot 818 in an air filter frame 822 of the air filter enclosure 812 can receive a replaceable air filter prior to inserting the handle 832. FIG. 10 illustrates that retention of the air filter enclosure 812 can be provided by a latching side tab 836. The air filter enclosure 812 retains a tool-less attachment capability and achieves complete air filtration coverage for an air intake. The visual operating status 853 can be visible through the air filter enclosure 812, retaining an OEM monitoring capability for the operator.

Figure 11:
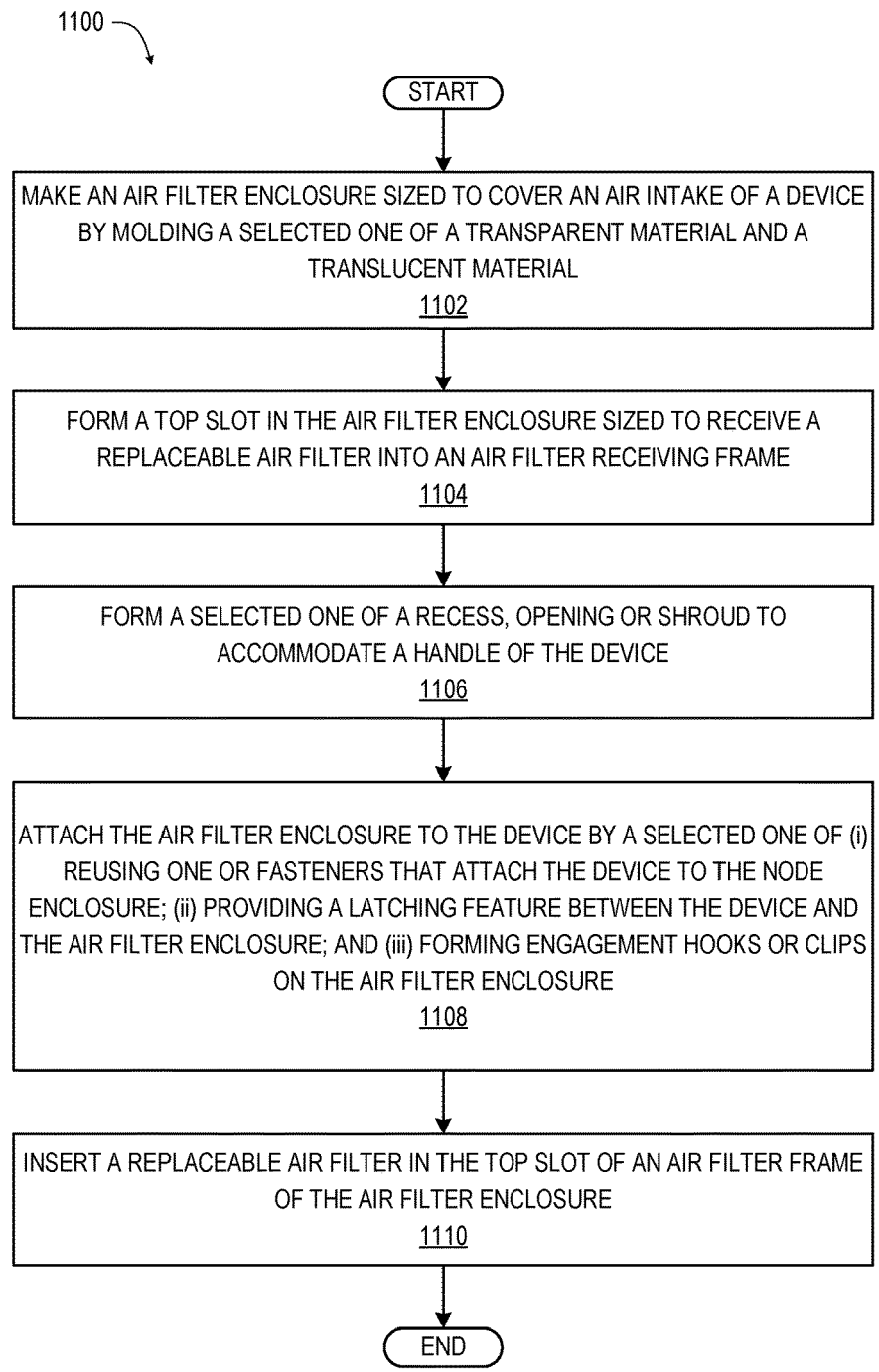
FIG. 11, illustrates a flow diagram of a method of making and attaching an air filter enclosure to an IHS, according to one or more embodiments.

FIG. 11 illustrates a method 1100 of making and attaching an air filter enclosure to an IHS. In one or more embodiments, the method 100 includes making an air filter enclosure to create an air filter receiving frame that is sized to cover an air intake of a device by molding a selected one of a transparent material and a translucent material (block 1102). Molding provides an economical form of manufacture. Selecting a material that allows passage of light enables retrofitting devices that already provide a visual indicator of an operating status of the device or node. The visual indicator can be adjacent to the air intake such that attaching the air filter enclosure covers over the visual indicator. Forming the air filter from transparent or translucent material can enable viewing of the visual indicator. As either part of the molding process or a secondary fabrication step, the method 1100 includes forming a top slot in the air filter enclosure to create an air filter receiving frame that is sized to receive a replaceable air filter into an air filter receiving frame (block 1104). As either part of the molding process or a secondary fabrication and assembly process, the method 1100 can include forming a selected one of a recess, opening or shroud to accommodate a handle of the device (block 1106). Method 1100 includes attaching the air filter enclosure to the device by a selected one of (i) reusing one or more fasteners that attach the device to the node enclosure; (ii) providing a latching feature between the device and the air filter enclosure; and (iii) forming engagement hooks or clips on the air filter enclosure (block 1108). Method 1100 includes inserting a replaceable air filter in the slot of the air filter frame of the air filter enclosure (block 1110). Then method 1100 ends.

In the above described flow charts of FIG. 11, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Figure 12:
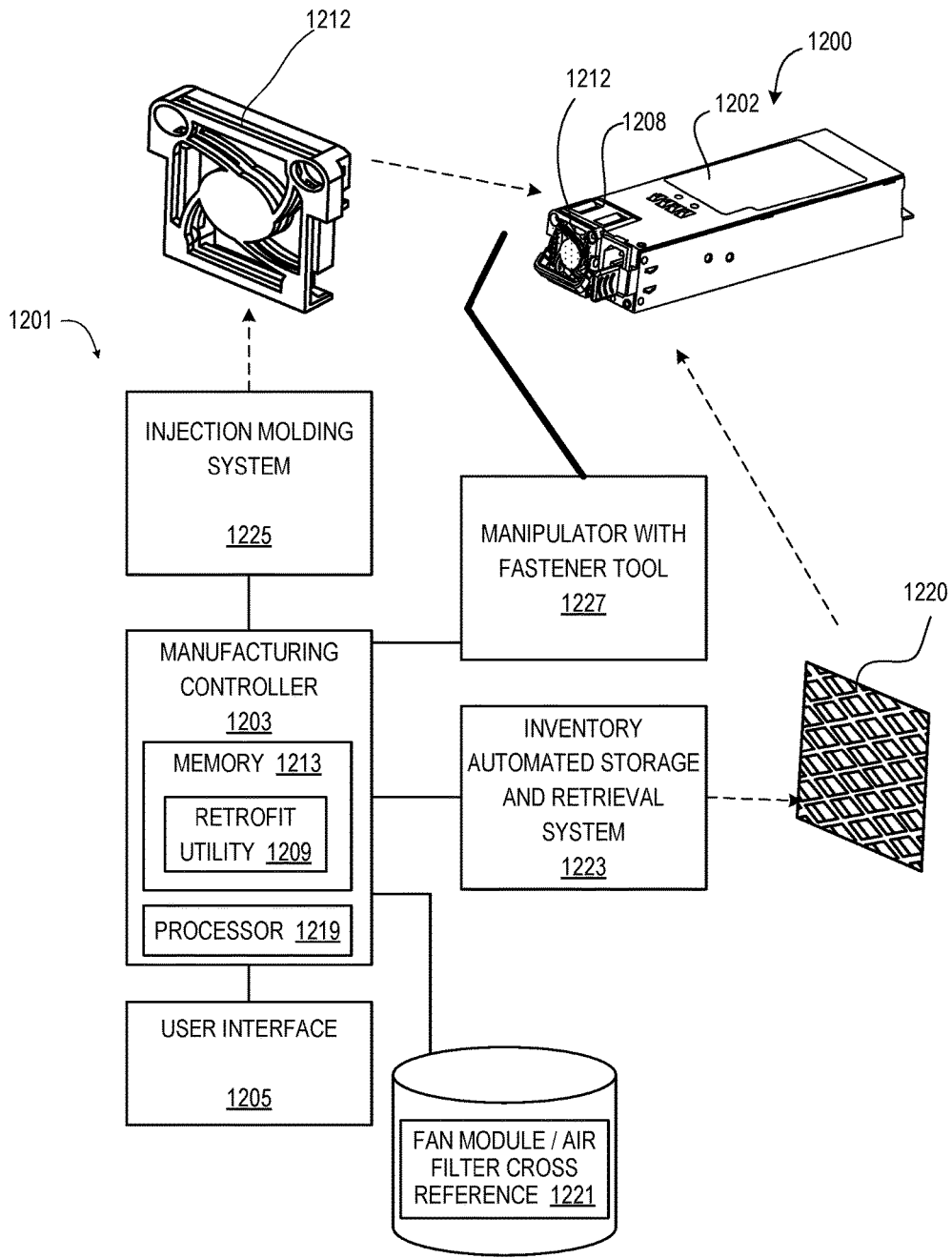
FIG. 12 illustrates a block diagram of a manufacturing system to manufacture and retrofit air filter enclosures on an IHS, according to one or more embodiments.

FIG. 12 illustrates a manufacturing system 1201 for manufacture of air filter enclosures 1212 and installation of air filter enclosures 1212 on an IHS 1200. For clarity, a single manufacturing controller 1203 forms an air filter enclosure 1212, although certain processes can be distributed by location or under separate control. A user interface 1205 provides a human interface to the manufacturing controller 1203 to initiate execution of an air filter retrofit utility 1209 contained in memory 1213 and executed on a processor 1219. The manufacturing controller 1203 can direct an injection molding system 1225 to convert a translucent or transparent material into the air filter enclosure 1212. Appropriate accommodations for the size of the air intake of the device and for any fastener locations, latch provided, or handles can be determined by the controller 1203 accessing a fan module or air filter cross reference 1221. An inventory automated storage and retrieval system 1223 can locate and provide commodity parts such as replaceable air filters 1220. A manipulator with fastener tool 1227 can attach the air filter enclosure to a device 1208 at a node 1202 of an IHS 1200.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system (IHS) comprising:
   a node comprising a node enclosure provisioned with at least one heat-generating component;
   a device that provides infrastructure support to the node and that contains an air mover attached to the node enclosure to create cooling air flow through the node to absorb and transfer thermal energy from the at least one heat-generating component, wherein the device comprises an exterior face having the air intake and an extraction handle attached to the exterior face; and an air filter enclosure attachable over an air intake of the device and comprising a slot sized to receive a manually inserted air filter into an air filter receiving frame, wherein the air filter enclosure comprises one or more openings that receive the extraction handle.

2. The IHS of claim 1, wherein:
the device comprises a visual indicator that is adjacent to the air intake and that conveys an operational status of one the device and the node; and
the air filter enclosure comprises a selected one of a transparent material and a translucent material that allows viewing of the operational status.

3. The IHS of claim 1, wherein:
the device comprises an exterior face having the air intake and having one or more device fastener holes proximate to the air intake;
the air filter enclosure comprises a mounting surface that is peripheral to the air filter receiving frame and having at least one enclosure fastener hole aligned with a selected one of the one or more device fastener holes of the exterior face of the device; and
a fastener passes through the at least one enclosure fastener hole and the selected one of the one or more device fastener holes to fasten together the air filter enclosure and the device.

4. The IHS of claim 3, wherein:
the device further comprises an extraction handle attached to the exterior face; and
the air filter enclosure comprises at least one edge relief area enabling positioning of the air filter enclosure over the air intake.

5. The IHS of claim 1, wherein:
the device comprises an exterior face having the air intake and an extraction handle projecting outwardly from the exterior face; and
the air filter enclosure comprises a shroud portion, the shroud portion comprising:
side walls defining an internal cavity proximally contacting the exterior face around the air intake and encompassing the extraction handle; and
one or more engagement clips internally presented inside the shroud portion to engage the extraction handle.

6. An air filter enclosure for an information handling system (IHS), the air filter enclosure comprising:
a replaceable air filter; and
an air filter enclosure attachable over an air intake of a device and comprising a top slot sized to receive the replaceable air filter into an air filter receiving frame, wherein the air filter enclosure comprises one or more openings that receive an extraction handle of the device:
the device contains an air mover attached to a node enclosure of a node of the IHS to create cooling air flow through the node to absorb and transfer thermal energy from at least one heat-generating component, wherein the device comprises an exterior face having the air intake and the extraction handle attached to the exterior face.

7. The air filter enclosure of claim 6, wherein the air filter enclosure comprises a selected one of a transparent material and a translucent material allowing passage of light from a visual indicator that is adjacent to the air intake and that conveys an operational status of the device.

8. The air filter enclosure of claim 6, wherein:
the air filter enclosure comprises a mounting surface peripheral to the air filter receiving frame and having at least one enclosure fastener hole aligned with a selected one of one or more device fastener holes through the exterior face of the device; and
a fastener passing through the at least one enclosure fastener hole and the selected one of the one or more device fastener holes to fasten together the air filter enclosure and the device.

9. The air filter enclosure of claim 8, wherein the air filter enclosure comprises at least one edge relief area enabling positioning of the air filter enclosure over the air intake of the device having an extraction handle attached to the exterior face.

10. The air filter enclosure of claim 6, further comprising a shroud portion comprising:
side walls defining an internal cavity proximally contacting the exterior face around the air intake and encompassing an extraction handle projecting outwardly from an exterior face of the device; and
one or more engagement clips internally presented inside the shroud portion to engage the extraction handle.

11. The air filter enclosure of claim 6, comprising a molded component.

12. The air filter enclosure of claim 6, wherein the air filter enclosure comprises one or more openings that receive an extraction handle attached to an exterior face of the device.

13. A method of installing an air filter enclosure and air filter in an information handling system (IHS), the method comprising:
making an air filter enclosure to create an air filter receiving frame that is sized to cover an air intake of an air mover device that attaches to a node enclosure of a node of the HIS, wherein the device comprises an exterior face having the air intake and an extraction handle attached to the exterior face;
forming a top slot in the air filter enclosure to create an air filter receiving frame that is sized to receive a replaceable air filter into the air filter receiving frame, wherein the air filter enclosure comprises one or more openings that receive the extraction handle; and
attaching the air filter enclosure to the air mover device.

14. The method of claim 13, further comprising molding the air filter enclosure from a selected one of a transparent material and a translucent material allowing passage of light from a visual indicator that is adjacent to the air intake and that conveys an operational status of the device.

15. The method of claim 13, wherein:
making the air filter enclosure comprises:
forming a mounting surface peripheral to the air filter receiving frame that includes at least one enclosure fastener hole aligned with a selected one of one or more device fastener holes through the exterior face of the device; and
forming a selected one of an edge relief area and one or more openings enabling positioning of the air filter enclosure over the air intake of the device having an extraction handle attached to the exterior face; and
attaching the air filter to the device comprises attaching a fastener that passes through the at least one enclosure fastener hole and the selected one of the one or more device fastener holes to fasten together the air filter enclosure and the device.

16. The method of claim 13, wherein making the air filter enclosure comprises forming a shroud portion having (i) side walls defining an internal cavity proximally contacting the exterior face around the air intake and encompassing an extraction handle projecting outwardly from an exterior face of the device; and (ii) one or more engagement clips internally presented inside the shroud portion to engage the extraction handle.

\* \* \* \* \*